Jan. 23, 1973 A. A. SCHWARTZ 3,713,034
AUDIO SIGNAL CONTROLLED AMPLITUDE MODULATION CIRCUIT OF SQUARE WAVE OUTPUT
Filed Oct. 26, 1971
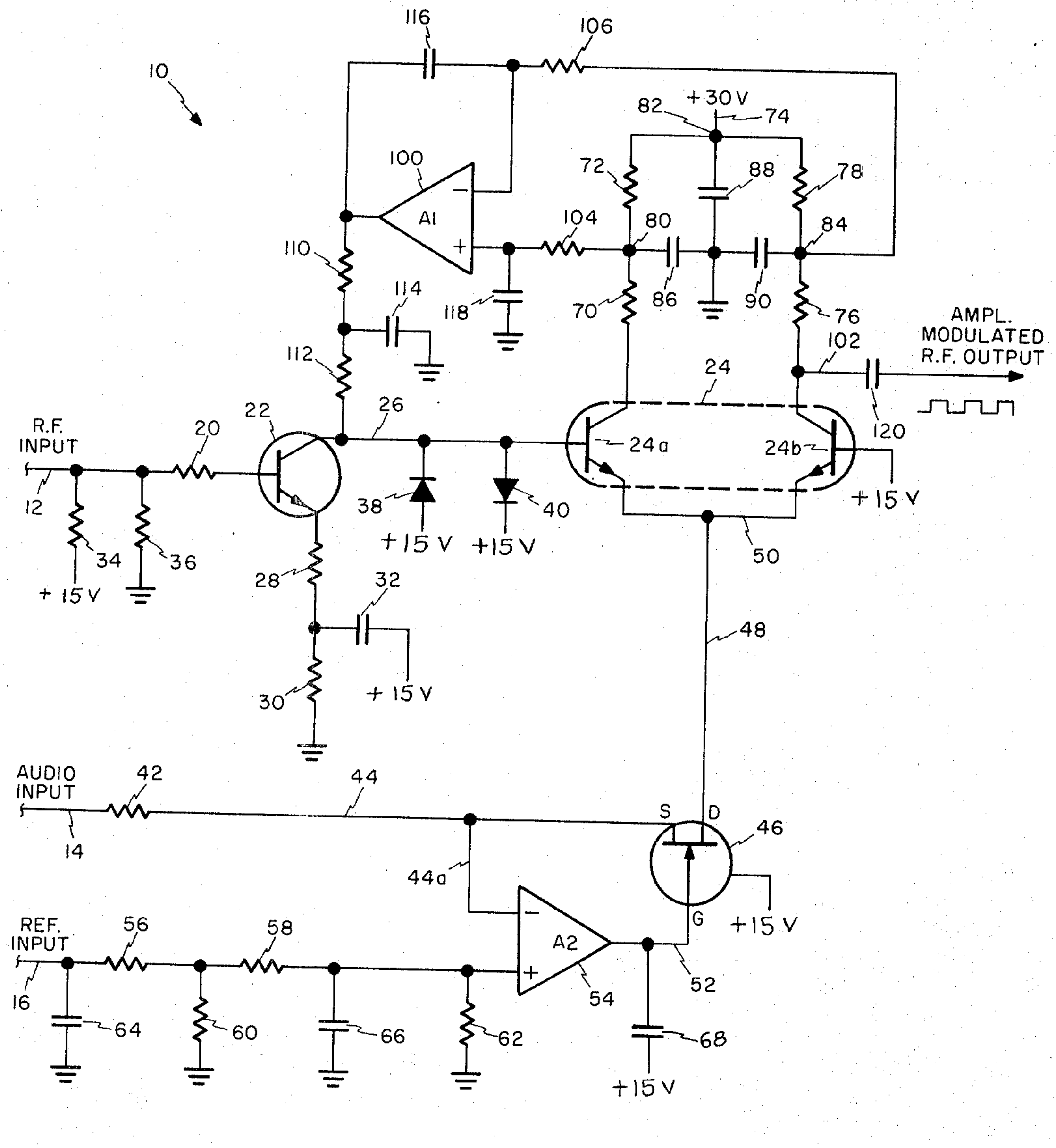

3,713,034

AUDIO SIGNAL CONTROLLED AMPLITUDE MODULATION CIRCUIT OF SQUARE WAVE OUTPUT

Allan A. Schwartz, Orange, Calif., assignor to the United States of America as represented by the Secretary of the Navy Filed Oct. 26, 1971, Ser. No. 192,120
Int. Cl. H03c *1/06*
U.S. Cl. 332—31 T 7 Claims

ABSTRACT OF THE DISCLOSURE

Amplitude modulation of a radio frequency with minimum distortion and good linearity is accomplished by driving a squaring circuit of the alternately conducting two transistor type at the radio frequency while using the audio signal to control amplitude of the square wave output. Bridge and differential amplifier feedback means are used to assure 50% duty cycles for the squaring circuit transistors.

BACKGROUND OF THE INVENTION

This invention relates to modulation circuits and more particularly to a circuit for providing an amplitude modulated R.F. (radio frequency) output signal of square waveform from a sinusoidal R.F. input signal and an audio input signal. Such a modulation circuit is desirable for use in certain telemetry systems, for example a system wherein it is desired to have the information outputs of a plurality of relatively widely spaced hydrophones fed over a common carrier, such as a coaxial cable R.F. transmission line, to a central data reception point. In such a system each hydrophone audio output is used to modulate an oscillator generated R.F. signal, and the modulated signal applied to the R.F. transmission line. The hydrophones are typically each served by a preamplifier and an equalizer circuit from which the audio signal is derived for application to a modulator circuit where it modulates the sinusoidal output of an R.F. oscillator.

Among the problems of the above described type of system are a need for suppression of harmonic distortion in the information channel (sideband harmonic distortion), and a need for exceptional linearity in operation.

SUMMARY OF THE INVENTION

With the foregoing in mind it is a principal object of this invention to provide an improved amplitude modulation circuit which provides a marked reduction of harmonic distortion as well as intermodulation distortion.

Another object of the invention is to provide a modulation circuit of the foregoing character which exhibits improved linearity in operation.

Yet another object of this invention is the provision of an improved amplitude modulation circuit which is simple in design and construction and reliable in operation.

As another object the invention aims to accomplish the foregoing through the provision of a modulation circuit which converts the sinusoidal R.F. oscillator input into square waveform which is amplitude modulated. The invention further contemplates automatically maintaining substantial equality between the durations of half cycles of the modulated square wave output. Stated another way, the invention serves to maintain very nearly 50% power in each side of the modulated square wave output. This serves to minimize second and other even harmonic distortions.

Other objects and advantages of modulation circuits embodying the invention will become apparent from the following description of a presently preferred embodiment when read in conjunction with the accompanying drawing.

DESCRIPTION OF THE DRAWING

The sole figure, partly schematic and partly in block form, illustrates an amplitude modulation circuit embodying the invention.

DESCRIPTION OF THE PREFERRED EMBODIMENT

In the form of the invention illustrated in the sole figure, there is provided an amplitude modulation circuit 10 which is adapaed to use as part of a hydrophone telemetry system as described earlier. The circuit 10 receives on conductor 12 an electrical R.F. signal of sinusoidal form as one input, on conductor 14 an electrical audio frequency signal of arbitrary waveform as a second input, and on conductor 16 an electrical reference signal as a third input. The R.F. signal is conveniently derived from a suitable source, not shown, such as a crystal controlled local oscillator. The audio signal is, in the case of the actual embodiment being described, the amplified output of a hydrophone, while the reference signal input on conductor 16 is provided by an equalizer circuit (not shown), the purpose of which is to provide a reference base for the degree of amplitude modulation to be effected. The sources of the R.F. signal, the audio signal, and the reference signal are not material to the invention, and are mentioned only to provide a better understanding of one system in which modulation circuits embodying the invention have been used to advantage.

The R.F. input on conductor 12 is applied through a resistor 20 to the base of a transistor 22 which is connected in common emitter configuration to serve as a driver amplifier for a squaring circuit comprising a matched pair of transistors *24a* and *24b* conveniently housed as a single unit 24. Thus, the collector of the driver transistor 22 is connected by conductor 26 to the base of the transistor *24a*, while the emitter of the transistor 22 is connected through resistors 28, 30, and capacitor 32 to a positive 15 volt supply. Resistors 34, 36 are provided to achieve proper impedence match with the oscillator from which the R.F. signal is derived, and the proper bias for the base of the transistor 22. The sinusoidal output of the driver amplifier is clipped by the action of diodes 38, 40 to provide a more effective input signal to the squaring circuit which serves to produce a square wave output at the frequency of the R.F. input signal but having an amplitude determined by the audio input signal on line 14. To this end, the audio input signal is coupled by a resistor 42, a conductor 44, a field effect transistor 46, and conductors 48 and 50 to the emitters of the transistors *24a* and *24b*.

The field effect transistor 46, which has its source terminal connected to conductor 44, its drain terminal connected to conductor 48, and its gate terminal connected by a conductor 52 to the output of an operational amplifier 54, serves as a voltage controlled current source. In this regard it cooperates with the amplifier 54 to control the audio input level to the squaring circuit in accordance with the reference signal input on conductor 16 from an equalizer circuit. The negative input connection of the amplifier 54 receives a portion of the audio input signal via line *44a*, while the positive input connection of the amplifier 54 receives the reference signal input via conductor 16 and a filter network including resistors 56, 58, 60, 62, and capacitors 64 and 66. A capacitor 68 is provided to improve stability of the amplifier 54.

The collector of the transistor *24a* of the squaring circuit is connected through series resistors 70 and 72 to a positive D.C. voltage source represented by line 74, while the collector of transistor *24b* is connected through series resistors 76, 78 to that voltage source. The junctions 80, 82, 84 of the resistors 70, 72, 76, 78 are coupled by capacitors 86, 88, and 90 to ground, as shown. The resistors 70, 72, 76 and 78 form the legs of a bridge circuit for a purpose which will be made apparent as the description proceeds.

The transistors *24a*, *24b* are alternately driven off and on in accordance with the input to the base of the transistor *24a*, which input is a summation of the output of the driver amplifier transistor 22 and feedback provided by an operational amplifier 100. The purpose of this feedback is to assure that each of the transistors *24a* and *24b* operates as close as possible to a 50% duty cycle. This is to say the squaring circuit is caused to minimize differences in durations between positive and negative half cycles in the output which is taken from the collector of the transistor *24b* on conductor 102.

When the squaring circuit is in operation at the frequency imposed by the R.F. input signal, the junctions 80 and 84 of the aforementioned bridge circuit will, because of the combined action of the bridge resistors and the time constants of the capacitors 86, 88, and 90, exhibit substantially equal voltages as long as the duty cycles of the two transistors are equal. If, however, the duty cycles of these two transistors differ, than a change in durations of current flows in the respective load resistors 70 and 76 will be represented by a corresponding difference in potential between the junctions 80 and 84. This difference is applied via resistors 104 and 106, respectively, to the positive and negative input connections of the operational amplifier 100. The latter serves to apply a feedback voltage, which is a function of the input differential, via resistors 110 and 112 to the conductor 26 for summation with the output of transistor 22 and application to the base of transistor *24a* of the squaring circuit. The resistors cooperate with a capacitor 114 to smooth the feedback voltage. This feedback voltage serves to offset the R.F. signal to the squaring circuit in a direction which will tend to cause the duty cycle of each transistor *24a*, *24b* to seek 50% operation. Capacitors 116 and 118 serve to stabilize or damp operation of the amplifier.

R.F. square wave output on line 102 is characterized by half cycles which are accurately maintained at equal duration. Moreover, the square wave output on line 102 is amplitude modulated by the audio input on line 14, and the control of the duty cycles of the squaring circuit is independent of such amplitude modulation, a situation which has been found to provide a minimum of second and higher even harmonic distortions in the final output.

In a system such as the multiple hydrophone telemetry system described above, the output on line 102 is capacitively coupled, as by capacitor 120, to a conventional R.F. amplifier prior to insertion in the common R.F. coaxial transmission cable.

In a practical working embodiment of the invention wherein the R.F. input frequency was in the range of 1.3 to 2.1 mHz., elements were used having values or designations according to the following table:

| | |
|---|---|
| Resistor: | |
| 20 | 110 ohms. |
| 28 | 150 ohms. |
| 30 | 2.2K ohms. |
| 34 | 10K ohms. |
| 36 | 20K ohms. |
| 42 | 614.4 ohms. |
| 56 | 147K ohms. |
| 58 | 1.5K ohms. |
| 60 | 9.38K ohms. |
| 62 | 4K ohms. |
| 70 | 750 ohms. |
| 72 | 4K ohms. |
| 76 | 750 ohms. |
| 78 | 4K ohms. |
| 104 | 237K ohms. |
| 106 | Do. |
| 110 | 110 ohms. |
| 112 | 3.3K ohms. |
| Capacitor: | |
| 32 | .01 mfd. |
| 64 | .1 mfd. |
| 66 | .1 mfd. |
| 68 | 51 pfd. |
| 86 | 3900 pfd. |
| 88 | .01 mfd. |
| 90 | 3900 pfd. |
| 114 | 3900 pfd. |
| 116 | 1 mfd. |
| 118 | 1 mfd. |
| 120 | 68 pfd. |
| Diode: | |
| 38 | 1N4500. |
| 40 | 1N4500. |
| Transistor: | |
| 22 | 2N918. |
| 24a, 24b | MD918a. |
| 46 | 2N4416. |
| Amplifier: | |
| 54 | HA2600 (Harris semiconductor). |
| 100 | LM201A (National semiconductor). |

It will be understood that the foregoing values and designations are given by way of example only, and that various other values, designations, substitutions, additions and omissions of elements may be made as the application to which the invention is put may demand.

Obviously many modifications and variations of the present invention are possible in the light of the above teachings. It is therefore to be understood that within the scope of the appended claims the invention may be practiced otherwise than as specifically described.

What is claimed is:

1. A circuit for providing an amplitude modulated R.F. signal of square waveform from a sinusoidal R.F. input signal and an audio input signal, said circuit comprising:
   - a squaring circuit;
   - a driver amplifier responsive to said R.F. input signal and connected to drive said squaring circuit to generate a square wave output signal at the frequency of said R.F. input signal;
   - voltage controlled current source means for controlling current flow into said squaring circuit as a function of said audio input signal, whereby said square wave output signal is amplitude modulated in accordance with said audio input signal;
   - said squaring circuit comprising
     - first and second transistors each having an emitter, a collector and a base;
     - said emitters both being connected to said voltage controlled current source means;

first and second load resistors connected respectively in series with said collectors of said first and second transistors;

said base of one of said transistors being connected to nominal ground; and said base of the other of said transistors being coupled to the output of said driver amplifier means whereby said first and second transistors are alternatively driven between conductive and non-conductive conditions at the frequency of said R.F. input signal to provide square wave output which is taken from one of said collectors.

2. A circuit for providing an amplitude modulated R.F. signal of square waveform from a sinusoidal R.F. input signal and an audio input signal, said circuit comprising:

a squaring circuit;

a driver amplifier responsive to said R.F. input signal and connected to drive said squaring circuit to generate a square wave output signal at the frequency of said R.F. input signal;

voltage controlled current source means for controlling current flow into said squaring circuit as a function of said audio input signal, whereby said square wave output signal is amplitude modulated in accordance with said audio input signal;

means for sensing differences in durations between opposite half cycles of said square wave output;

differential amplifier means responsive to such differences and operative to provide an output which is summed with said output of said driver amplifier for input to said squaring circuit and which tends to balance the durations of opposite half-cycles.

3. An amplitude modulation circuit as defined in claim 2, and wherein said squaring circuit comprises:

first and second transistors each having an emitter, a collector and a base;

said emitters both being connected to said voltage controlled current source means;

first and second load resistors connected respectively in series with said collectors of said first and second transistors;

said base of one of said transistors being connected to nominal ground; and said base of the other of said transistors being coupled to the output of said driver amplifier means whereby said first and second transistors are alternatively driven between conductive and non-conductive conditions at the frequency of said R.F. input signal to provide square wave output which is taken from one of said collectors.

4. An amplitude modulation circuit as defined in claim 2, and wherein:

said means for sensing differences in amplitude comprises a resistor and capacitor network connected between a source of voltage and said first and second resistors so as to form a bridge circuit therewith; and said differential amplifier means having first and second input connections connected across said bridge circuit to detect inequalities in current flow in said first and second load resistors.

5. An amplitude modulation circuit as defined in claim 4, and wherein said squaring circuit comprises:

first and second transistors each having an emitter, a collector and a base;

said emitters both being connected to said voltage controlled resistance means;

first and second load resistors connected respectively in series with said collectors of said first and second transistors;

said base of one of said transistors being connected to nominal ground; and said base of the other of said transistors being coupled to the output of said driver amplifier means whereby said first and second transistors are alternatively driven between conductive and non-conductive conditions at the frequency of said R.F. input signal to provide square wave output which is taken from one of said collectors.

6. An amplitude modulation circuit as defined in claim 4, and wherein said voltage controlled resistance means comprises:

a field effect transistor having its source and drain connections in series with said audio input and said squaring circuit;

a second differential amplifier having one input connected to receive said audio signal and another input connected to receive a reference signal;

said field effect transistor having its gate connection connected to receive the output of said differential amplifier.

7. An amplitude modulation circuit as defined in claim 6, and wherein said squaring circuit comprises:

first and second transistors each having an emitter, a collector and a base;

said emitters both being connected to said voltage controlled resistance means;

first and second load resistors connected respectively in series with said collectors of said first and second transistors;

said base of one of said transistors being connected to nominal ground; and said base of the other of said transistors being coupled to the output of said driver amplifier means whereby said first and second transistors are alternatively driven between conductive and non-conductive conditions at the frequency of said R.F. input signal to provide square wave output which is taken from one of said collectors.

References Cited

UNITED STATES PATENTS

| | | | |
|---|---|---|---|
| 3,229,230 | 1/1966 | Feldman | 332—31 T X |
| 2,905,815 | 9/1959 | Goodrich | 332 9 T X |
| 3,044,025 | 7/1962 | McCauley | 332—31 T X |

ALFRED L. BRODY, Primary Examiner

U.S. Cl. X.R.

307—264; 328—168; 332—37 D